(12) United States Patent
Loewen et al.

(10) Patent No.: US 9,894,802 B2
(45) Date of Patent: Feb. 13, 2018

(54) PASSIVE SYSTEM OF POWERING AND COOLING WITH LIQUID METAL AND METHOD THEREOF

(71) Applicants: Eric Paul Loewen, Wilmington, NC (US); Weston Matthew Cundiff, Wilmington, NC (US); Seth Strege, Wilmington, NC (US)

(72) Inventors: Eric Paul Loewen, Wilmington, NC (US); Weston Matthew Cundiff, Wilmington, NC (US); Seth Strege, Wilmington, NC (US)

(73) Assignee: GE-Hitachi Nuclear Energy Americas LLC, Wilmington, NC (US)

( * ) Notice: Subject to any disclaimer, the term of this patent is extended or adjusted under 35 U.S.C. 154(b) by 314 days.

(21) Appl. No.: 14/290,267

(22) Filed: May 29, 2014

(65) Prior Publication Data

US 2015/0351216 A1 Dec. 3, 2015

(51) Int. Cl.
| | | |
|---|---|---|
| *H05K 1/02* | (2006.01) | |
| *H05K 7/20* | (2006.01) | |
| *H01L 23/427* | (2006.01) | |
| *H01L 23/473* | (2006.01) | |

(52) U.S. Cl.
CPC ....... *H05K 7/20272* (2013.01); *H01L 23/427* (2013.01); *H01L 23/473* (2013.01); *H05K 1/0203* (2013.01); *H05K 1/0272* (2013.01)

(58) Field of Classification Search
CPC ............. H05K 1/0204; H05K 7/20263; H05K 7/20136; H05K 7/20272; H05K 7/20218; H05K 7/20245; H05K 7/20281; H05K 1/0201; H05K 1/0203

USPC ......................................... 361/696, 698, 699
See application file for complete search history.

(56) References Cited

U.S. PATENT DOCUMENTS

| | | | | |
|---|---|---|---|---|
| 4,257,556 A | * | 3/1981 | Skala .................... | F24H 7/0433 165/10 |
| 4,590,993 A | * | 5/1986 | Kurzweg ............... | F03G 7/002 165/10 |
| 5,050,037 A | | 9/1991 | Yamamoto et al. | |
| 5,107,920 A | * | 4/1992 | Scotti .................... | B64D 13/00 165/104.31 |
| 5,238,056 A | * | 8/1993 | Scotti .................... | B64D 13/00 165/104.31 |

(Continued)

OTHER PUBLICATIONS www.bbc.com/news/science-environment, "IBM unveils Computer Fed by 'Electronic Blood'", Oct. 18, 2013.

*Primary Examiner* — Robert J Hoffberg
*Assistant Examiner* — Matt Dhillon
(74) *Attorney, Agent, or Firm* — Harness, Dickey & Pierce, P.L.C.

(57) ABSTRACT

Example embodiments disclose a passive system of power and cooling with a liquid metal for a digital system. The passive system may include a digital device operatively coupled to a printed circuit board, a hollow conductive channel body attached to the printed circuit board to circulate the liquid metal to flow within the conductive channel so as to convey electrical power to the digital device during a power loss and transfer heat generated by the digital device, and a tube to deliver the liquid metal in and out of the hollow conductive channel body. A method of operating a liquid metal may involve the use of the passive system.

20 Claims, 6 Drawing Sheets

(56) References Cited

U.S. PATENT DOCUMENTS

| | | | | |
|---|---|---|---|---|
| 6,019,165 A * | 2/2000 | Batchelder | | F25B 21/02 165/104.33 |
| 6,460,595 B1 * | 10/2002 | Benz | | B22D 23/10 164/46 |
| 6,631,753 B1 * | 10/2003 | Carter, Jr. | | B22D 23/10 164/348 |
| 6,708,501 B1 * | 3/2004 | Ghoshal | | H01L 23/473 165/104.19 |
| 7,131,286 B2 * | 11/2006 | Ghoshal | | H01L 23/473 257/E23.098 |
| 7,324,340 B2 | 1/2008 | Xiong | | |
| 7,340,904 B2 * | 3/2008 | Sauciuc | | F28D 15/00 257/E23.098 |
| 7,505,272 B2 * | 3/2009 | Gilliland | | H01L 23/473 165/80.3 |
| 7,539,016 B2 * | 5/2009 | Sauciuc | | F28D 15/0266 257/714 |
| D614,590 S | 4/2010 | Lee | | |
| 7,764,499 B2 * | 7/2010 | Sauciuc | | F28D 15/0266 257/714 |
| 8,017,872 B2 * | 9/2011 | Cripe | | H05K 1/0272 174/252 |
| 8,174,830 B2 * | 5/2012 | Lower | | H05K 1/0272 165/104.33 |
| 8,221,089 B2 * | 7/2012 | Lower | | H02K 44/04 310/11 |
| 8,232,091 B2 * | 7/2012 | Maltezos | | B01L 3/50851 435/283.1 |
| 8,263,030 B1 * | 9/2012 | Jones | | C01D 7/00 423/201 |
| 8,650,886 B2 * | 2/2014 | Wilcoxon | | F04B 17/00 136/210 |
| 8,789,377 B1 * | 7/2014 | Brostmeyer | | F02C 7/16 60/728 |
| 2005/0099775 A1 | 5/2005 | Pokharna et al. | | |
| 2006/0131003 A1 * | 6/2006 | Chang | | F28D 15/0266 165/104.33 |
| 2007/0121299 A1 * | 5/2007 | Campbell | | H01L 23/3677 361/710 |
| 2009/0226971 A1 * | 9/2009 | Beer | | B01L 3/502784 435/91.2 |
| 2009/0308081 A1 * | 12/2009 | Ouyang | | H01L 23/38 62/3.2 |
| 2010/0064518 A1 * | 3/2010 | Lower | | H01L 23/36 29/890.039 |
| 2010/0066178 A1 * | 3/2010 | Lower | | H02K 44/04 310/11 |
| 2013/0017629 A1 * | 1/2013 | Pyo | | H01L 22/26 438/16 |
| 2015/0257306 A1 * | 9/2015 | Glew | | H05K 7/20254 165/104.28 |
| 2015/0289410 A1 * | 10/2015 | Salat | | H01L 23/473 361/699 |

* cited by examiner

PASSIVE SYSTEM OF POWERING AND COOLING WITH LIQUID METAL AND METHOD THEREOF

BACKGROUND

Field

The present disclosure relates to passive systems of powering and cooling with liquid metal and methods of using the same in a nuclear reactor.

Description of Related Art

Modern nuclear reactors use a variety of digital systems for both control and safety. These systems must be redundant, diverse, fault tolerant and extensive in self-diagnosis while the system is in operation. Meanwhile, in the digital industry, the desire to increase computational power while decreasing component sizes results in local heat generation within a digital device. Even more damaging heat can occur when this is coupled with the extreme unknown conditions of a nuclear power plant during a severe accident, in which the ambient temperature surrounding electronic components could result in digital system faults. In other words, "loss of integrity" and/or "loss of operation" of digital systems due to high heat environments is attained.

Further, conventional digital systems have power supplies and heat removal systems such as fans or heat sinks in the control cabinets. Large server 'farms' are essentially located within large cooled refrigerators so that the digital equipment operates at its optimal temperature. However, as digital systems get faster (e.g., boiling water reactor (BWR) has a data sampling rate measured in milliseconds with computer chips operating in the MHz ranges), it becomes more difficult for a nuclear power plant control system to establish an environment like a server farm and the cooling system must operate at an extreme level. Previous techniques in the industry have used liquid cooling (water) to better dissipate heat for faster and denser electronic components.

BRIEF DESCRIPTION OF EXAMPLE EMBODIMENTS

At least one embodiment relates to a passive system of powering and cooling with a liquid metal.

A passive system of power and cooling with a liquid metal for a digital system, may include a digital device operatively coupled to a printed circuit board, a hollow conductive channel body attached to the printed circuit board to circulate the liquid metal to flow within the hollow conductive channel body so as to convey electrical power to the digital device during a power loss and transfer heat generated by the digital device, and a tube to deliver the liquid metal in and out of the hollow conductive channel body.

In a further example embodiment, the passive system may include a heat exchanger. The liquid metal may enter the heat exchanger and may transfer heat to a cooler gas flowing through the heat exchanger.

In yet a further example embodiment, the tube including the heated liquid metal may enter the heat exchanger to be cooled and then the cooled liquid metal may be conveyed back to the digital device to be cooled.

In an example embodiment, the passive system may include a fan in the heat exchanger to enhance transfer of heat.

In an example embodiment, the tube may create a closed-loop system, in which the liquid metal circulates between the digital device and the heat exchanger.

In an example embodiment, the passive system may include an electromagnetic pump to increase a flow of the liquid metal.

In an example embodiment, the tube may be made out of metal to transfer heat to an outside environment.

In an example embodiment, the passive system may include another printed circuit board. The conductive channel may be located between two printed circuit boards, wherein the liquid metal passes through the conductive channel body to supply power and transfer heat.

In a further example embodiment, a via tube may extend through the conductive channel body and the two printed circuit boards.

In an example embodiment, the liquid metal may be electrically charged such that the electrically charged liquid metal may enter and may progress up through the via tube to deliver power to the digital device.

In a further example embodiment, the passive system may include an external wire pattern on a surface of a top printed circuit board to connect the via tube and the digital device to deliver power.

In an example embodiment, the liquid metal may be at least one of pure sodium and a sodium potassium compound.

At least one embodiment relates to a method of powering and cooling a passive system with a liquid metal.

A method of powering and cooling with a liquid metal for a digital system, may include operatively coupling a digital device to a printed circuit board, attaching a hollow conductive channel body to the printed circuit board, circulating the liquid metal to flow through the hollow conductive channel body, conveying electrical power to the digital device during a power loss via the liquid metal, and transferring heat generated by the digital device via the liquid metal.

In an example embodiment, the method may include circulating the liquid metal out of the conductive channel and into a duct, and connecting the tube to a heat exchanger.

In a further example embodiment, the liquid metal may enter the heat exchanger and may transfer heat to a cooler gas flowing through the heat exchanger.

In a further example embodiment, the cooled liquid metal exiting from the heat exchanger may be conveyed back to the conductive channel body to cool the digital device.

In an example embodiment, the method may include increasing a flow of the liquid metal in the tube via an electromagnetic pump.

In a further example embodiment, the method may include electrically charging the liquid metal to deliver power to the digital device.

In a further example embodiment, the method may include a via tube, which may extend through the conductive channel body and the printed circuit board.

In a further example embodiment, the method may include an external wire pattern on a surface of a top printed circuit board to connect the via tube and the digital device to deliver power.

BRIEF DESCRIPTION OF THE DRAWINGS

The various features and advantages of the non-limiting embodiments herein may become more apparent upon review of the detailed description in conjunction with the accompanying drawings. The accompanying drawings are merely provided for illustrative purposes and should not be interpreted to limit the scope of the claims. The accompanying drawings are not to be considered as drawn to scale unless explicitly noted. For purposes of clarity, various dimensions of the drawings may have been exaggerated.

DETAILED DESCRIPTION OF EXAMPLE EMBODIMENTS

Detailed descriptions of the illustrative embodiments are disclosed herein. Specific structural and functional details are also disclosed herein, however, are merely representative for purposes of describing the example embodiments. For example, although the example embodiments may be described with reference to a nuclear power plant, it is understood that the example embodiments may also be useable in other types of industrial facilities. These facilities may have a need for the elimination of hard-wired, point-to-point connections for field equipment but need a robust digital system with safety functions. The example embodiments may be exemplified in many alternate forms and should not be construed as being limited to the specified example embodiments set forth herein.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It should be understood that, although the terms first, second, third, etc. may be used herein to describe various elements, components, regions, layers and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of example embodiments.

Spatially relative terms (e.g., "beneath," "below," "lower," "above," "upper," and the like) may be used herein for ease of description to describe one element or feature's relationship to another element(s) or feature(s) as illustrated in the figures. It should be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

At least one example embodiment discloses a passive system of power and cooling with a liquid metal for a digital system. At least one example embodiment includes a digital device operatively coupled to a printed circuit board, a hollow conductive channel body attached to the printed circuit board to circulate the liquid metal to flow within the hollow conductive channel body so as to convey electrical power to the digital device during a power loss and transfer heat generated by the digital device, and a tube to deliver the liquid metal in and out of the hollow conductive channel body.

At least one example embodiment discloses a method of powering and cooling with a liquid metal for a digital system. At least one example embodiment includes operatively coupling a digital device to a printed circuit board, attaching a hollow conductive channel body to the printed circuit board, circulating the liquid metal to flow within the hollow conductive channel body, conveying electrical power to the digital device during a power loss via the liquid metal, and transferring heat generated by the digital device via the liquid metal.

A further example embodiment describe a cooling method, which when used, will produce a passive system of powering and cooling for a digital system required as a safety system. Hence, the issue of "loss of integrity" or "loss of operation" of digital systems due to high heat environments may be avoided and/or reduced.

Further, utilizing a power/cooling device provides a new way to minimize the risk faults in the digital control section of a nuclear reactor. An important aspect of risk mitigation is the prevention of plant damage and the escape of radioactive material into the environment.

A further example embodiment provides a system and method that modifies existing digital devices to bring in power and remove heat.

A further example embodiment uses liquid metal to convey electrical power to the digital device and remove heat from the digital device with the same liquid metal. The liquid metal may be circulated in a closed-loop system, and through a basic heat exchange process, the heat may be expelled to the environment. Furthermore, in the event of normal power supply loss, example embodiments re-establish power to the digital device with a backup battery supply connected to the system. This may prevent and/or reduce any loss of the safety function(s) of the digital device.

A further example embodiment provides the digital device to operate at a lower temperate (while in operation), and under extreme events (where environmental cooling is lost), discharge heat at a higher rate.

Figure 1:
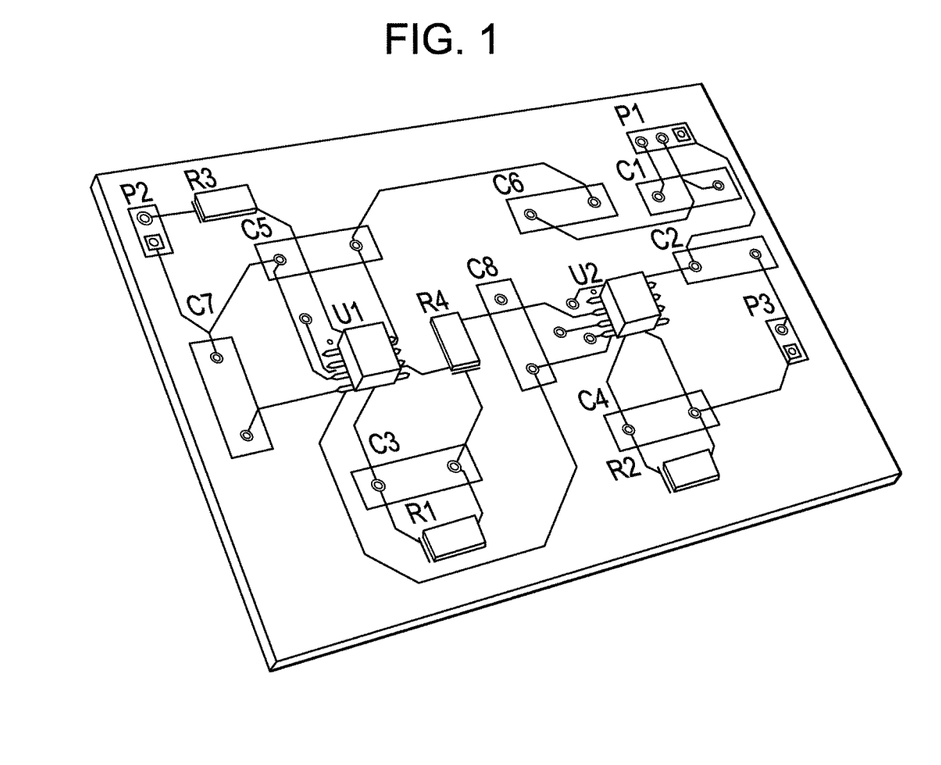
FIG. 1 is a schematic view of a conventional digital device on a printed circuit board.

FIG. 1 is a schematic view of a conventional digital device on a printed circuit board. More specifically, FIG. 1 depicts a conventional digital device embedded on a printed circuit board (PCB). It is noted that conventional digital devices have an optimal operating range of −40° C. to +85° C. For a basic +5V digital device, the supply current can be about 90 mA, which results in a power of 0.45W. Accordingly, some printed circuit boards in nuclear safety systems could contain anywhere from 50-100 digital devices, bringing the total power of the board up to 22.5W -45W. Compounding more devices on a single board can quickly cause the environment around the board to heat up due to the dissipated heat from the printed circuit boards.

Figure 2:
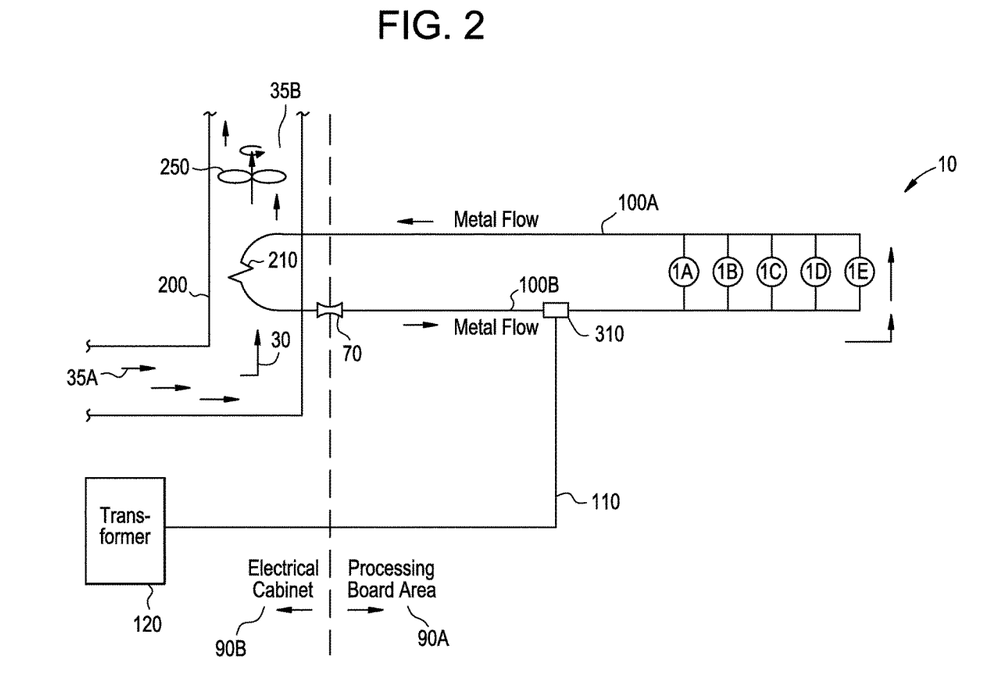
FIG. 2 is a system block diagram according to a non-limiting example embodiment.

FIG. 2 is a system block diagram according to a non-limiting example embodiment. Referring to FIG. 2, a passive system 10 may include digital devices 1A-1E, tubes 100A, 100B conveying liquid metal therein, and a heat exchanger 200. Tube 100A transports the heated liquid metal to the heat exchanger 200 and tube 100B transports the cooled liquid metal back to the digital devices 1A-1E. The tubes 100A, 100B create a closed-loop system, such that the liquid metal circulates between the digital devices 1A-1E and the heat exchanger 200. The tubes 100A, 100B may be thermally conductive as well to transfer heat. In an example embodiment, the tubes 100A, 100B may be made of metal (e.g., copper, silver, aluminum, zinc, nickel, brass, bronze, pure iron and platinum). However, it should be appreciated that other types may be employed, depending on the type of liquid metal and its application.

In example embodiments, the digital devices 1A-1E may be Programmable Logic Devices (PLDs), Erasable Programmable Read Only Memory (EPROMs), digital signal processors, Field Programmable Logic Devices (FPGAs), etc. It should be appreciated that the digital devices 1A-1E may be made out of various materials, including but not limited to, silicon, plastic, copper, silver, and/or gold.

The digital devices 1A-1E (provided in a processing board area 90A of the passive system 10) may be cooled by the liquid metal flowing from the heat exchanger 200 via circulation through the tube 100B. The heated liquid metal (having a temperature range of 75° C.-100° C., for example) may enter the heat exchanger 200 at an area where the tube 100A intersects the heat exchanger 200 and transfers heat to a cooler gas flow 30 (having a temperature range of 20° C.-30° C., for example) entering through an entrance 35A of the heat exchanger 200. The cooler gas flow may then flow upward past a heating coil 210 in the heat exchanger 200 and exit out an exit 35B of the heat exchanger 200. Further, the cooling flow may be enhanced with a fan 250 provided in the heat exchanger 200. The cooler liquid metal (having a temperature range of 30° C.-50° C., for example) may then flow back towards the digital devices 1A-1E via tube 100B.

The flow of the liquid metal may further be enhanced by an electromagnetic pump 70. The electromagnetic pump 70 may be inserted into or attached to the tube 100B near the vicinity of the heat exchanger 200, for example. However, it should be appreciated that the location of the electromagnetic pump 70 may be at any location along the tubes 100A, 100B. It should further be appreciated that there may be more than one electromagnetic pump 70 in the passive system 10. The electromagnetic pump 70 may not have any moving parts, thereby causing no additional friction in the flow field. In the event of a loss of primary power, the electromagnetic pump 70 may not be available to drive the liquid metal. Hence, the passive system 10 may be adequately designed to ensure that the fluid can passively continue to flow (and therefore cool the device) by means of gravity and density changes in the liquid metal. Furthermore, it should be appreciated that since the electromagnetic pump 70 does not have any moving parts; there will be no additional friction in the flow field to hinder passively driving of the cooling flow in the event of lost operating power. This process can continue as long as a heat sink (not shown) in the heat exchanger 200 maintains an adequate cooling supply (this can be extended by shutting off all unnecessary electronic equipment or by using a passively air driven heat sink).

The passive system 10 may further use the liquid metal to convey electrical power to the digital devices 1A -1E. In the event of a loss of normal power, an uninterruptable power supply may be used to maintain a consistent voltage level within the circuitry. For instance, electricity may be supplied via the liquid metal (and thus the entire device) as a power supply.

As a result, the passive system 10 may use the liquid metal to convey electrical power to the digital devices 1A-1E while at the same time remove heat from the digital devices 1A-1E with the same liquid metal. The liquid metal may be circulated in a loop and through a basic heat exchange process while ejecting the heat to the environment. In the event of normal power supply loss, the passive system 10 may re-establish power to the digital devices 1A-1E and act as a backup battery supply connected to the circuit. Hence, this prevents any loss of safety function of the digital devices 1A-1E.

Figure 3:
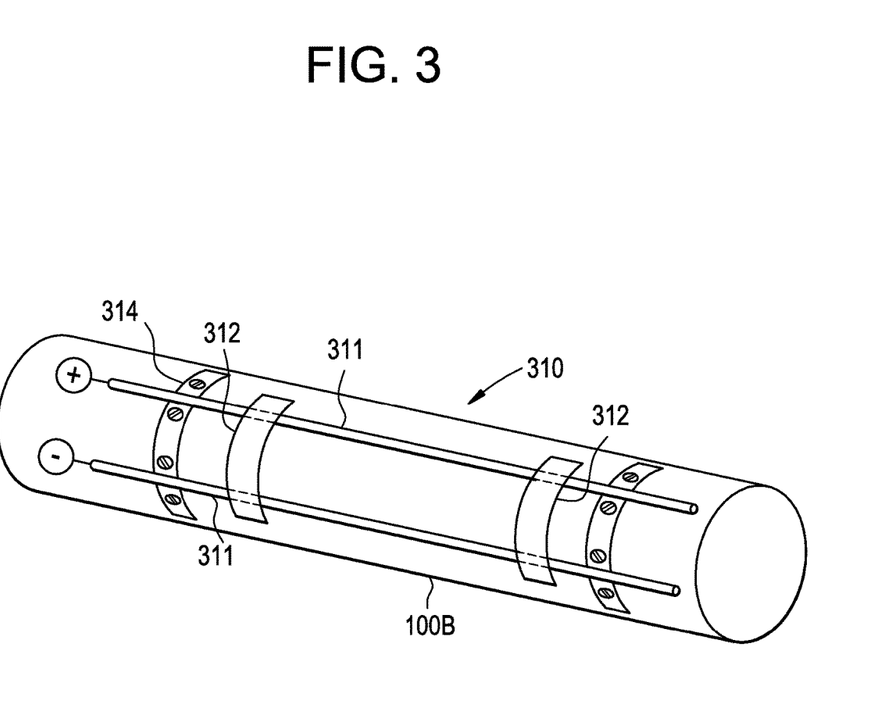
FIG. 3 is a schematic view of an electromigration device attached to a tube according to a non-limiting example embodiment.

FIG. 3 is a schematic view of an electromigration device attached to a tube according to a non-limiting example embodiment.

Referring to FIG. 3, the power may be delivered to the liquid metal by an electromigration device 310. The electromigration device 310 may be attached to an exterior surface of the tube 100B to deliver electricity to the digital devices 1A-1E in the event of power loss. The electromigration device 310 may include two opposed molybdenum rods 311 supported at two locations by cylindrical ceramic inserts 312 to deliver electrons to the liquid metal. One of the molybdenum rods 311 may be a positive electrode and the other molybdenum rod 311 may be a negative electrode.

The cylindrical ceramic inserts 312 may be attached to the exterior surface of the tube 100B so as to transfer the electrons from the molybdenum rods 311 to the liquid metal. For additional support, the molybdenum rods 311. may be secured beyond an area of the tube 100B by a. clamp 314 made from a.n inert electrically non-conductive rigid material, for example. It should be appreciated that other connections and/or supports may be used to attach the rnolybdem rrrrods 311 to the tube 100B.

Referring back to FIG. 2, the molybdenum rods 311 may he connected to a wire 110 which is connected to a transformer 120. The transformer 120 may be located away from the digital devices 1A-1E. In an example embodiment, the transformer 120 may be located in an electrical cabinet area 90B which is located away from the processing board area 90A. This removes the heat generation in the transformer 120 by moving it away from the digital processing board area 90A.

It should be appreciated that a back-up battery (not shown) may be utilized in the passive system 10 as an additional power source in case the primary power is shut off.

Figure 4A:
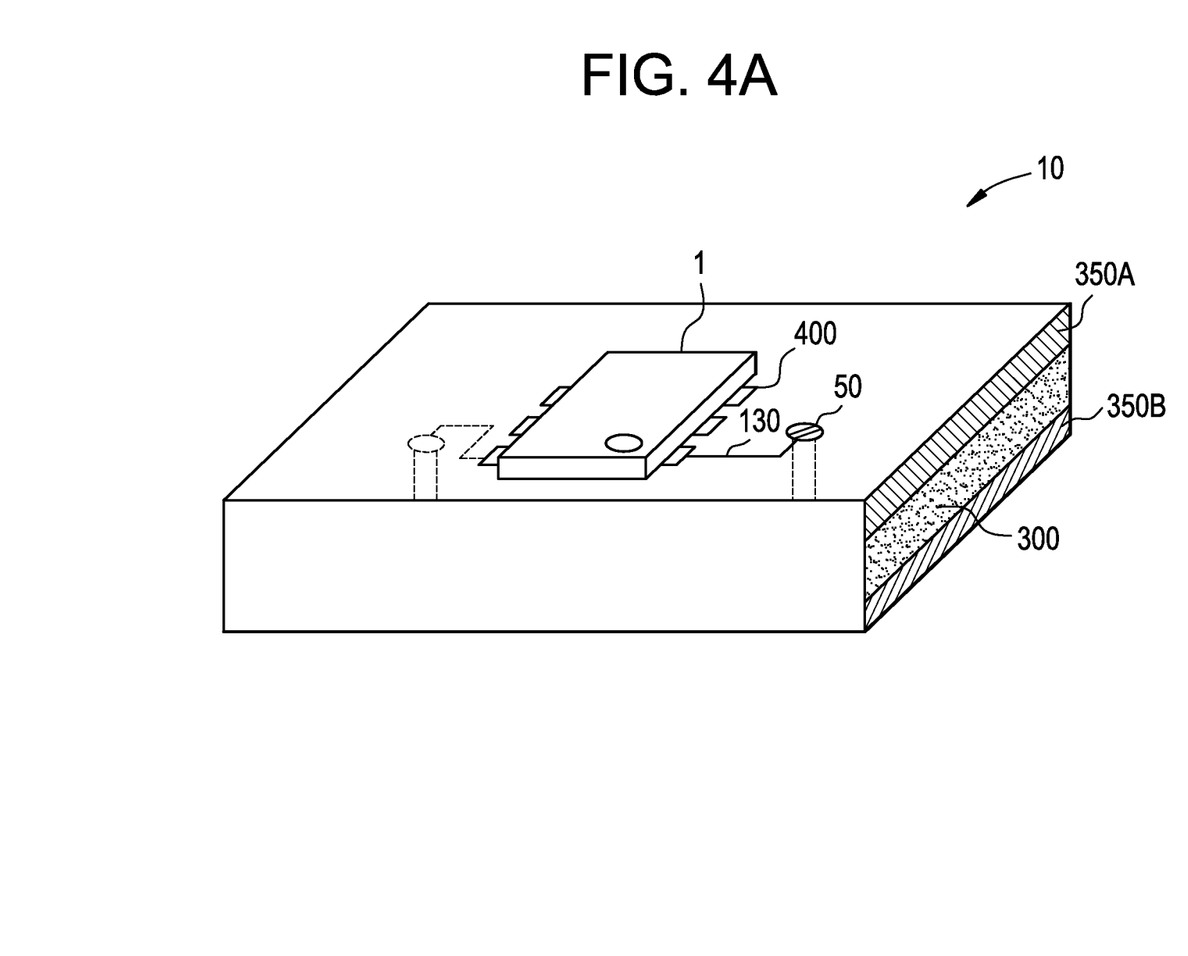
FIG. 4A is a schematic view with a side cross-sectional view of a passive system of proportional powering and cooling with liquid metal according to a non-limiting example embodiment.

FIG. 4A is a schematic view of a passive system of powering and cooling with liquid metal according to a non-limiting example embodiment.

Referring to FIG. 4A, the passive system 10 may include a digital device 1 operatively connected to a substrate, e.g., a printed circuit board 350A. The printed circuit board 350A may be attached to a conductive channel body 300 to circulate the liquid metal to flow within the conductive channel body 300 to transfer heat generated by the digital device 1 and convey electrical power to the digital device 1 during a power loss. The conductive channel body 300 may be hollow so that the liquid metal may flow therein. In an example embodiment, the conductive channel body 300 may be in shape of a rectangular box, rectangular prism, or rectangular parallelepiped. It should be appreciated that other shapes of the conductive channel body 300 may be formed. The conductive channel body 300 may be made of a material that allows liquid metal to flow through and transfer heat and/or provide power to the digital device 1. In an example embodiment, the conductive channel body 300 may be made of metal (e.g., copper, silver, aluminium, zinc, nickel, brass, bronze, pure iron and platinum). However, it should be appreciated that other types may be employed, depending on the type of liquid metal and its application. It should further be appreciated that the conductive channel body 300 and the tube 100 may be made from the same material or may be made from a combination of various materials.

Figure 4B:
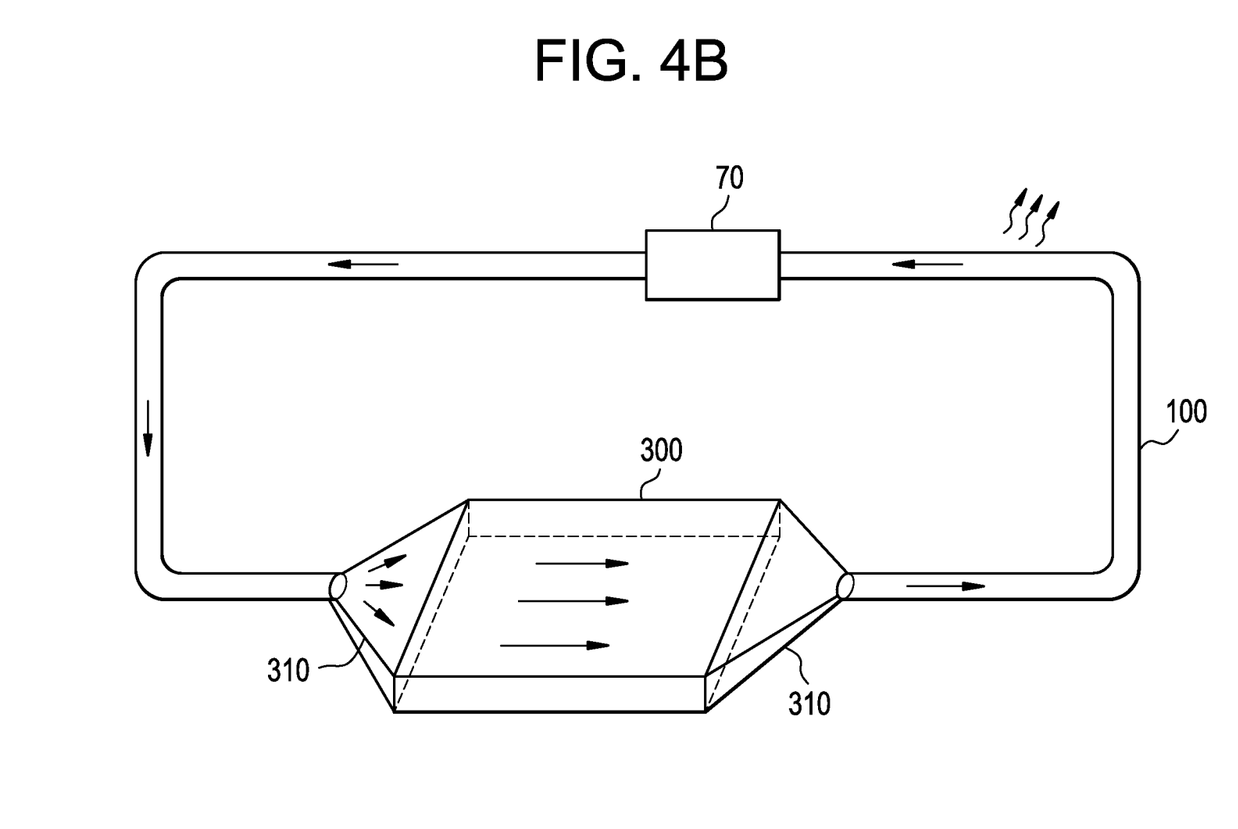
FIG. 4B is a schematic view of a tube and connector according to a non-limiting example embodiment.

Referring to FIG. 4B, the conductive channel body 300 may be connected to the tube 100 with a connector 310. The connector 310 may act as an expander to expand the liquid metal from the tube 100 into the conductive channel body 300. There may be a connector 310 on each side of the conductive channel body 300, i.e., at an inlet side and an outlet side. The connector 310 may increase the surface area of the liquid metal contacting the printed circuit board 350A to transfer heat. In an example embodiment, the connector 310 may be made of metal (e.g., copper, silver, aluminum, zinc, nickel, brass, bronze, pure iron and platinum). However, it should be appreciated that other types may be employed, depending on the type of liquid metal and its application. It should further be appreciated that the connector 310 and the conductive channel body 300 may be made from the same material or may be made from a combination of various materials.

It should further be appreciated that the conductive channel body 300, the connector 310 and the tube 100 may be integrally formed or may be separately formed.

Referring back to FIG. 4A, there may be more than one printed circuit boards, 350A and 350B, for example. The conductive channel body 300 may be between the printed circuit boards 350A and 350B to transfer heat and/or bring power into the digital device 1. The additional print circuit board 350B, for example, may increase the conductive heat transfer.

The conductive channel body 300 may fully consist of the liquid metal flowing therein. The liquid metal may typically have a high thermal conductivity property, and thus may enable it to easily extract the heat generated by the digital device 1 that is attached to the printed circuit boards 350A and 350B. The liquid metal should have a low freezing point (liquid to solid) and a high boiling point (liquid to gas) properties. In one example embodiment, the freezing point may be low (e.g., −10 degrees Celsius or lower). The boiling point may be high (e.g., 2080 degrees Celsius or higher). This may enable the liquid metal to operate in various temperature conditions. Moreover, the liquid metal should have a low electrical resistivity so as to allow the movement of electrons through the liquid metal. Thus, the liquid metal may be of a type to transfer heat and/or deliver power. In example embodiments, the liquid metal may be at least one of pure sodium, or an alloy, such as sodium potassium (NaK), copper, gold, silver, and gallium-indium (Ga—In).

The digital device 1 may include pins 400 connected to the printed circuit board 350A. It should be appreciated that the digital device 1 may be connected to the printed circuit board 350A by other arrangement types, such as a ball grid array (BGA) type, a tab terminal type, etc.

While FIG. 4A illustrates only one digital device; it should be appreciated that more than one digital device may be attached to the printed circuit board 350A.

A via tube 50 may extend through the printed circuit boards 350A and 350B and the conductive channel body 300 in a vertical direction, and may enhance the conveyance of the electrical signal to/from the digital device 1 and the conductive channel body 300. The via tube 50 may deliver the electrical signals to the digital device 1 through an external wire trace pattern 130 provided on a top surface of the printed circuit board 350A. The external wire trace pattern 130 may connect the via tube 50, which may contain the conductive liquid metal therein, to the conductive channel body 300 to deliver power. In other words, in an event of loss of power, because the via tube 50 is filled with conductive liquid metal, the digital device 1 may still receive power to operationally operate the digital device 1 via the external wire trace pattern 130. Hence, the via tube 50 acts as a conduit to connect the conductive channel body 300 to the external wire trace pattern 130, which is connected to the digital device 1.

Further, since the liquid metal may also service as coolant, the liquid metal contained in the via tube 50 may be pumped by the electromagnetic pump 70 through tube 100 and the heat that is absorbed from the digital device 1 may be released into the environment and/or exchanged in the heat exchanger 200. It should be appreciated that the characteristic design of the digital device 1 and the connections to the conductive channel body 300 may be changed as long as the design continues to entail the two features of supplying power and removing heat from the digital device 1.

Figure 5:
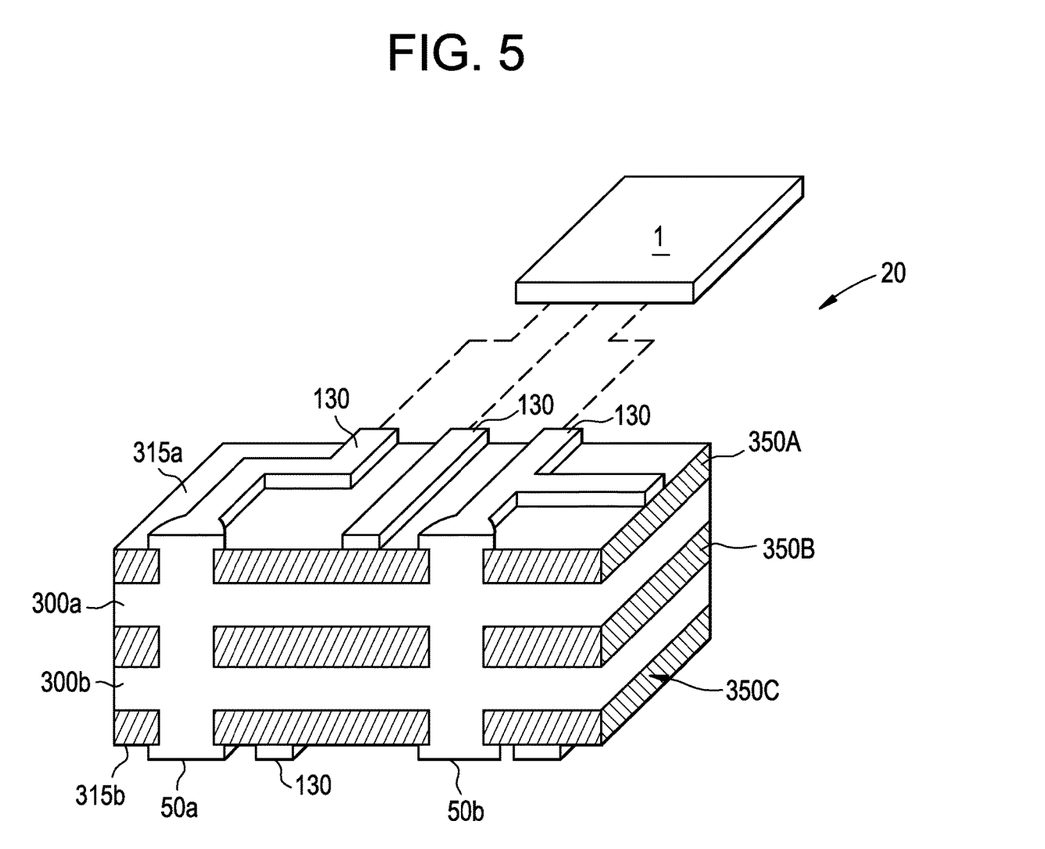
FIG. 5 is a partial cross-sectional view of a passive system of proportional powering and cooling with liquid metal according to another non-limiting example embodiment.

FIG. 5 is a partial cross-sectional view of a passive system of powering and cooling with liquid metal according to another example embodiment.

Like numerals will be used to represent the same elements as compared to FIGS. 4A and 4B, with duplicity of elements found in FIG. 5. For example, FIG. 5 illustrates more than one via tube and several layers of the printed circuit boards.

Referring to FIG. 5, a multi-layered substrate 20 having a plural layer structure is shown. The multi-layered structure 20 may include via tubes 50*a* and 50*b* penetrating through three printed circuit boards 350A, 350B, 350C. It should be appreciated that the printed circuit boards 350A, 350B, 350C may be made out of non-conducting materials, such as, but not limited to fiberglass and/or plastic. In an example embodiment, the printed circuit boards 350A, 350B, 350C may each be 12.6 millimeter thick. As an example, a total height of the multi-layered substrate 20 may be 37.8 millimeters. However, it should be appreciated that other dimensions may be utilized depending on its application.

Liquid metal may be introduced into the multi-layered substrate 20 through one of the conductive channel bodies 300*a*, 300*b*. The conductive channel bodies 300*a*, 300*b*, containing the liquid metal, may be in communication with each other by via tubes 50*a*, 50*b*. In other words, if liquid metal enters through conductive channel body 300*a*, the liquid metal may enter into the other conductive channel body, i.e., conductive channel body 300*b*, through via tube 50*a* and/or via tube 50*b*. Similarly, if liquid metal enters through conductive channel body 300*b*, the liquid metal may enter into the conductive channel body 300*a* through via tube 50*a* and/or via tube 50*b*.

It should be appreciate that there may be more than one location that liquid metal may enter into the multi-layered substrate 20. In an example embodiment, there may be two locations that the liquid metal may enter the multi-layered substrate 20, i.e., one through the conductive channel body 300*a* and the other through the conductive channel body 300*b*. In other words, the liquid metal exiting the tube 100 and into the connector 310 may enter through one or both of the conductive channel bodies 300*a* and 300*b*.

Further, as liquid metal is delivered to the conductive channel bodies 300*a* and 300*b*, the liquid metal may enter and progress up the via tubes 50*a*, 50*b* to transfer heat and deliver power to the digital device 1. More specifically, the liquid metal, which may be conductive, that entered through the via tubes 50*a*, 50*b* may be connected with the external wire trace pattern 130 formed on the printed circuit board 350A to delivery power to the digital device 1. More specifically, the external wire trace pattern 130 may be formed on an upper surface 315*a* of a top printed circuit board 350A. Similarly, it should be appreciated that the external wire trace pattern 130 may be formed on a bottom surface 315*b* of a bottom printed circuit board 350C. The external wire trace pattern 130 may deliver electrical signal and/or power to the digital device 1 attached to the printed circuit board 350A. It should be appreciated that the external wire trace pattern 130 may be connected to one or more digital device 1 on the upper surface 315*a* of the printer circuit board 350. It should further be appreciate that there may be several external wire trace patterns 130 on the upper surface 315*a* of printed circuit board 350A. It should further be appreciated that all of the external wire trace patterns 130 may be connected to each other providing an electrical connection between several digital devices.

Further, the external wire trace pattern 130 may be connected to the via tubes 50*a* and 50*b*, which may contain the liquid metal, to deliver power to the digital device 1 in case of loss of power. In other word, because the external wire trace pattern 130 connects the digital device 1 to the via tubes 50*a*, 50*b*, containing conductive the liquid metal, it may still be possible to deliver electrons to the digital device 1 and be operational even in an event of loss of primary power.

It should be appreciate that intermediate layers (not shown) may be provided in the multi-layered substrate 20. For example, the conductive channel body 300*a* may be provided between an intermediate layer (not shown) and the printed circuit board 350B. The conductive channel body 300*a* may be a power block that delivers power to the digital device. The conductive channel body 300*b* may be provided between an intermediate layer (not shown) and the printed circuit board 350B. The conductive channel body 300*b* may be a ground block that grounds the digital device.

It should be appreciated that internal wire trace patterns (not shown) may also be provided between the printed circuit boards 350A, 350B, 350C. The wire trace patterns may be imbedded in the printed circuit boards 350A, 350B, 350C to deliver electrical signals and/or power to the digital devices. It should be appreciated that the material of the internal wire trace patterns may be similar to those of the external wire trace patterns, including but not limited to, silicon, plastic, copper, silver, and/or gold.

According to various example embodiments, the liquid metal may be pure sodium, or an alloy, such as sodium potassium (NaK). Other conventional materials, such as copper, gold, silver, or gallium-indium (Ga—In), have been used.

As shown in TABLE 1, a comparison table of commonly used materials for either cooling and/or conducting electricity is provided. TABLE 1 includes pure sodium and a sodium potassium compound (NaK). As shown, the NaK (77% K) compound at 20° C. (a desired operating temperature) achieved the highest thermal conductivity at 21.8 W/mK and heat capacity at 0.971 J/gk. While the resistivity of NaK may be higher than that of copper (industry standard), it is noted that the lower performance may be balanced by NaK's exceptional thermal conductivity (two orders of magnitude higher that water). More specifically, the low resistivity of the liquid metal indicates that it readily allows the movement of electric charge. This in itself reduces the amount of heat that is generated on the board from powering the digital device. A conducting material with a higher resistance automatically produces heat as the electrons try to move through to their destination. The high heat removal capability and low resistance of liquid metals, such as Nak, makes it suitable for this application. Hence, the ability of liquid metal to have both high heat removal capability and low electrical resistivity is unique and has been utilized.

TABLE 1

| Conductor | Density (kg/m 3) | Heat Capacity (J/(g*K)) | Thermal Conductivity (W/(m*K)) | Resistivity (Ω*cm) |
|---|---|---|---|---|
| NaK (77% K at 99.85° C.) | $8.55 \times 10^2$ | 0.982 | 23 | $4.07 \times 10^{-5}$ |
| Nak (77% K at 20° C.) | $8.66 \times 10^2$ | 0.971 | 21.8 | $3.80 \times 10^{-5}$ |
| Ga—In (75% Ga at 20° C.) | $6.25 \times 10^3$ | — | — | $2.94 \times 10^{-5}$ |

TABLE 1-continued

| Conductor | Density (kg/m^3) | Heat Capacity (J/(g*K)) | Thermal Conductivity (W/(m*K)) | Resistivity (Ω*cm) |
|---|---|---|---|---|
| Na (at 99.85° C.) | $9.27 \times 10^2$ | 1.23 | 142 | $9.60 \times 10^{-6}$ |
| Copper (at 20° C.) | $8.94 \times 10^3$ | 0.385 | 401 | $1.68 \times 10^{-6}$ |
| Gold (at 20° C.) | $1.93 \times 10^4$ | 0.129 | 318 | $2.44 \times 10^{-6}$ |
| Silver (at 20° C.) | $1.05 \times 10^4$ | 0.233 | 429 | $1.59 \times 10^{-6}$ |
| Fresh Water (at 20° C.) | $1.00 \times 10^3$ | 4.1813 | 0.58 | $2.00 \times 10^3$ to $2.00 \times 10^5$ |
| Salt Water (at 20° C.) | $1.03 \times 10^3$ | 4.1813 | 0.58 | $2.00 \times 10^1$ |

The equation below shows Ziman's formula which is used to calculate the resistivity values of the materials shown in TABLE 1.

$$\rho_L = \frac{3\pi}{h|e|^2} \frac{1}{v_F^2} \frac{V}{N} \int_0^1 |<k+q|w|k>|^2 S(q)^4 \left(\frac{q}{2k_F}\right)^3 d\left(\frac{q}{2k_F}\right)$$

The Ziman's nearly free electron (NFE) theory describes the electrical resistivity of liquid metals. For both liquid and amorphous metals, the equation above can be used to find electrical resistivity. This calculation may be heavily based off of the structure factor of the metal, in this case S(q), as well as the Fermi surface, $2 k_F$.

According to example embodiments, the passive system removes a need for stationary power planes and power wires into a digital device.

According to example embodiments, the passive system provides conductive and convective heat transfer of a digital device.

According to example embodiments, the passive system allows a smaller Digital Control and Information System (DCIS) footprint in an operating plant.

According to example embodiments, the passive system facilities cooling in extreme environments. This may be attributable because ambient temperature increases more fluid that can be moved (i.e., less density).

According to example embodiments, the passive system provides a passive cooling in an event of a loss of power.

According to example embodiments, the passive system no longer requires a secondary cooling device on the outside of a digital device to remove heat. As a result, this saves considerable amount of space and cost.

While a number of example embodiments have been disclosed herein, it should be understood that other variations may be possible. Such variations are not to be regarded as a departure from the spirit and scope of the present disclosure, and all such modifications as would be obvious to one skilled in the art are intended to be included within the scope of the following claims.

The invention claimed is:

1. A passive system of powering and cooling with a liquid metal for a digital system, comprising:
   a digital device operatively coupled to a first printed circuit board;
   a hollow conductive channel body attached to the first printed circuit board to circulate the liquid metal to flow within the conductive channel body so as to transfer heat generated by the digital device and electrically charging the liquid metal to deliver electrical power to the digital device;
   a tube to deliver the liquid metal in and out of the hollow conductive channel body, the tube configured to passively deliver the liquid metal based on a flow that is induced by gravity and density changes in the liquid metal in the event of a loss of primary power; and
   a pair of electrodes operatively coupled to the tube to transfer electrons to the liquid metal.

2. The passive system of claim 1, further comprising a heat exchanger,
   wherein the liquid metal enters the heat exchanger and transfers heat to a cooler gas flowing through the heat exchanger.

3. The passive system of claim 2, wherein the tube including the heated liquid metal enters the heat exchanger to be cooled and then the cooled liquid metal is conveyed back to the digital device to be cooled.

4. The passive system of claim 2, further comprising a fan in the heat exchanger to enhance transfer of heat.

5. The passive system of claim 2, wherein the tube creates a closed-loop system, in which the liquid metal circulates between the digital device and the heat exchanger.

6. The passive system of claim 1, further comprising an electromagnetic pump to increase a flow of the liquid metal.

7. The passive system of claim 1, further comprising:
   a second printed circuit board, the conductive channel body being located between the first and second printed circuit boards,
   wherein the liquid metal passes through the conductive channel body to supply power and transfer heat.

8. The passive system of claim 7, wherein a via tube extends through the conductive channel body and the first and second printed circuit boards.

9. The passive system of claim 8, wherein the liquid metal is electrically charged such that the electrically charged liquid metal enters and progresses up through the via tube to deliver power to the digital device.

10. The passive system of claim 9, further comprising an external wire pattern on a surface of a top printed circuit board to connect the via tube and the digital device to deliver power.

11. The passive system of claim 1, wherein the liquid metal is at least one of pure sodium and a sodium potassium compound.

12. The passive system of claim 1, wherein the electrodes are respective rods attached to an exterior surface of the tube.

13. A method of powering and cooling with a liquid metal for a digital system, the method comprising:
   operatively coupling a digital device to a printed circuit board;
   operatively coupling a pair of electrodes to a tube to transfer electrons to the liquid metal, the tube configured to passively deliver the liquid metal based on a flow that is induced by gravity and density changes in the liquid metal in the event of a loss of primary power;
   attaching a hollow conductive channel body to the printed circuit board;
   circulating the liquid metal to flow through the hollow conductive channel body;
   conveying electrical power to the digital device via the liquid metal; and
   transferring heat generated by the digital device via the liquid metal.

14. The method of claim 13, further comprising:
connecting the tube to a heat exchanger.

15. The method of claim 14, wherein the liquid metal enters the heat exchanger and transfers heat to a cooler gas flowing through the heat exchanger.

16. The method of claim 15, wherein the cooled liquid metal exiting from the heat exchanger conveyed back to the conductive channel body to cool the digital device.

17. The method of claim 14, further comprising increasing a flow of the liquid metal in the tube via an electromagnetic pump.

18. The method of claim 13, further comprising electrically charging the liquid metal to deliver power to the digital device.

19. The method of claim 18, further comprising a via tube, which extends through the conductive channel body and the printed circuit board.

20. The method of claim 19, further comprising an external wire pattern on a surface of a top printed circuit board to connect the via tube and the digital device to deliver power.

* * * * *

UNITED STATES PATENT AND TRADEMARK OFFICE
CERTIFICATE OF CORRECTION

PATENT NO.       : 9,894,802 B2
APPLICATION NO.  : 14/290267
DATED            : February 13, 2018
INVENTOR(S)      : Eric Paul Loewen, Weston Matthew Cundiff and Seth Strege It is certified that error appears in the above-identified patent and that said Letters Patent is hereby corrected as shown below:

Column 7 Line 9-14, should read:
The cylindrical ceramic inserts 312 may be attached to the exterior surface of the tube 100B so as to transfer the electrons from the molybdenum rods 311 to the liquid metal. For additional support, the molybdenum rods 311 may be secured beyond an area of the tube 100B by a clamp 314 made from an inert electrically non-conductive rigid material, for example. It should be appreciated that other connections and/or supports may be used to attach the molybdenum rods 311 to the tube 100B.

Signed and Sealed this
Fifteenth Day of May, 2018

Andrei Iancu
*Director of the United States Patent and Trademark Office*